United States Patent [19]

Zasio et al.

[11] 4,191,916
[45] Mar. 4, 1980

[54] TABLE POSITIONING SYSTEM INCLUDING OPTICAL REFERENCE POSITION MEASURING TRANSDUCER

[75] Inventors: John J. Zasio, Sunnyvale; Michael W. Samuels, San Jose, both of Calif.

[73] Assignee: Fujitsu Limited, Kawasaki, Japan

[21] Appl. No.: 854,424

[22] Filed: Nov. 23, 1977

[51] Int. Cl.² .............................................. G05B 1/06
[52] U.S. Cl. .................................... 318/640; 250/201
[58] Field of Search ................. 318/640, 577; 250/201

[56] References Cited

U.S. PATENT DOCUMENTS

| | | | |
|---|---|---|---|
| 3,466,514 | 9/1969 | Brunner et al. | 318/577 |
| 3,719,879 | 3/1973 | Marcy | 318/640 X |
| 3,955,072 | 5/1976 | Johannsmeier et al. | 318/640 X |

*Primary Examiner*—B. Dobeck
*Attorney, Agent, or Firm*—David E. Lovejoy

[57] ABSTRACT

A table positioning apparatus suitable for use in an electron beam exposure system. A movable table holds a wafer or other work piece. The table is driven by a motor in response to a motor drive signal to position the table at different locations. An optical position measuring transducer is located in fixed relation to the table to establish a reference position for the table in a local region. The transducer provides a position signal as a function of the table position in the local region. An amplifier is provided which is responsive to the position signal to produce a servo signal. A motor drive circuit provides the motor drive signal for driving the motor in response to the servo signal so that the table is driven to the reference position. At the reference position, a reset signal is provided to reset interferometers in both X and Y axes.

18 Claims, 7 Drawing Figures

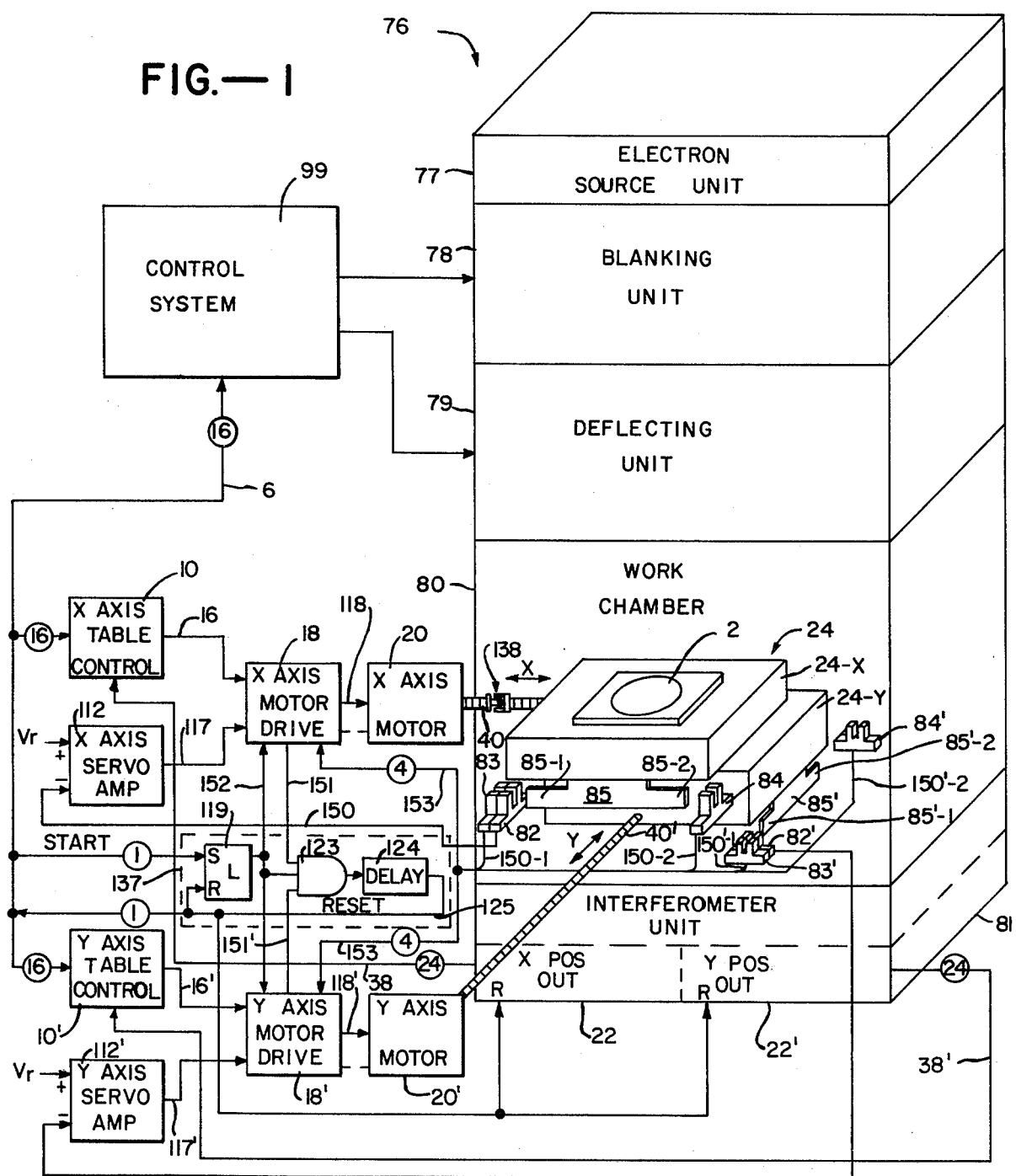
FIG.—1
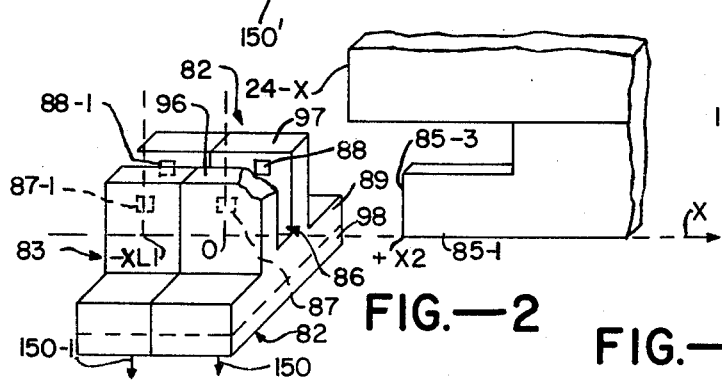
FIG.—2
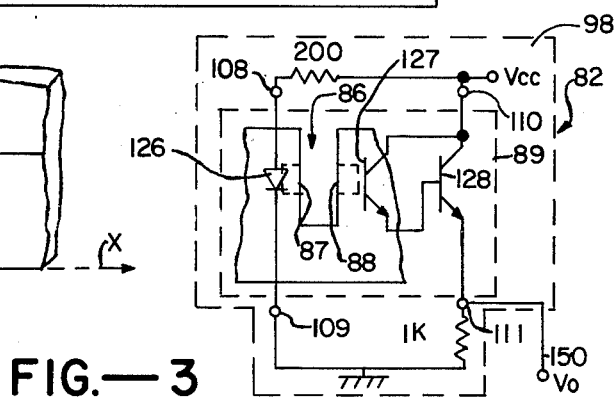
FIG.—3

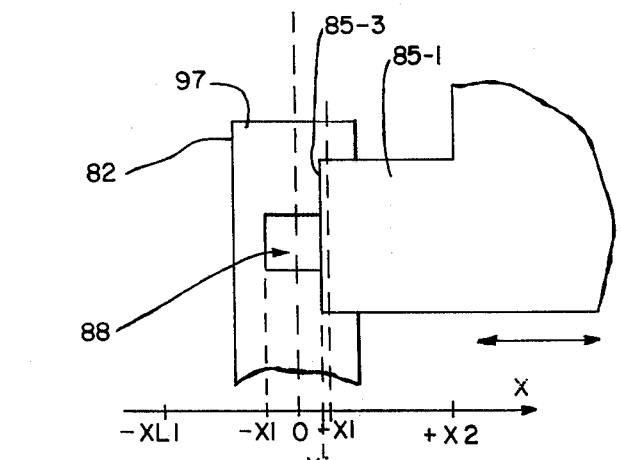
FIG.—4
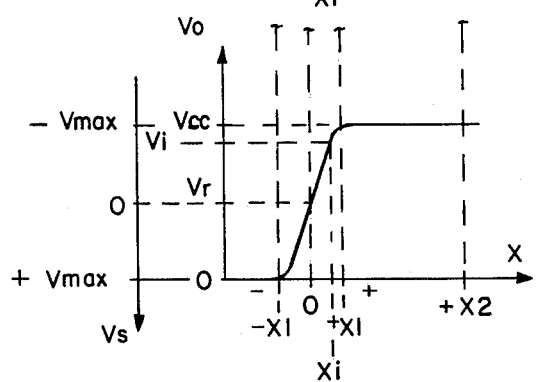
FIG.—5
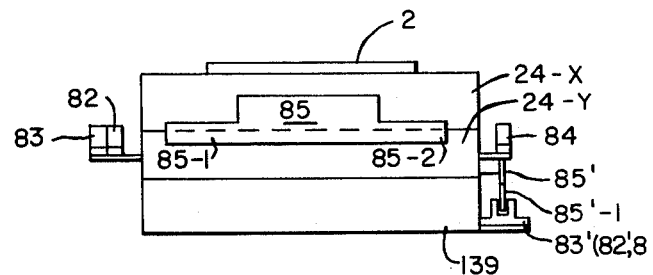
FIG.—6
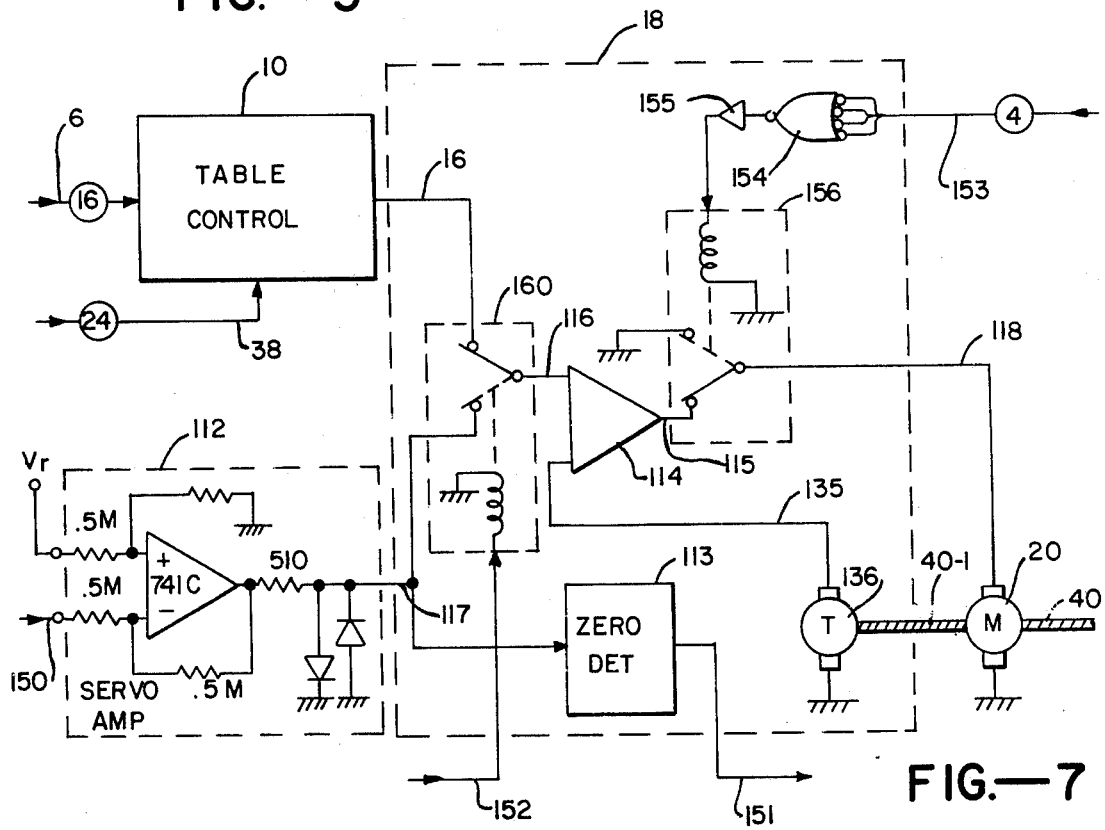
FIG.—7

4,191,916

TABLE POSITIONING SYSTEM INCLUDING OPTICAL REFERENCE POSITION MEASURING TRANSDUCER

CROSS REFERENCE TO RELATED APPLICATIONS

ELECTRON BEAM ESPOSURE SYSTEM METHOD & APPARATUS, invented by Fred K. Buelow and John J. Zasio, having Ser. No. 847,485, filed Nov. 1, 1977, now U.S. Pat. No. 4,147,937 and assigned to the same assignee as the present invention.

TABLE POSITIONING ALIGNMENT METHOD AND APPARATUS, invented by John J. Zasio, having Ser. No. 973,909, filed Dec. 28, 1978, and assigned to the same assignee as the present invention.

WAFER HOLDER WITH SPRING-LOADED WAFER-HOLDING MEANS, invented by Gabriel Zasio, having Ser. No. 845,496, filed Oct. 26, 1977, and assigned to the same assignee as the present invention.

BACKGROUND OF THE INVENTION

The present invention relates to a servo-controlled table positioning apparatus and more particularly to a positioning apparatus for accurately indicating when a table is at a predetermined reference location.

Servo-controlled table positioning systems are frequently employed when large-scale integrated circuits are fabricated under computer control. In one such system, a highly accurate electron beam exposure system exposes a semiconductor wafer or other work piece located on a servo-controlled table.

In order to fabricate integrated circuits, the table supporting the work piece is positioned relative to the incident electron beam. The electron beam is scanned over the work piece to expose an electron beam resist on the surface of the work piece. Each area to be scanned by the electron beam has a location determined by the table position. For accurate positioning of the work piece, the table supporting the work piece must be accurately positioned. Positioning with an accuracy of 1.0 micron or better is desirable. Such an accuracy is desirable for establishing an initial reference location of the table. The location of the table is then measured with respect to this initial reference location.

In semiconductor processing, it is often necessary to remove the work piece from the table for an intermediate step and then replace the work piece on the table for additional processing. The capability of accurately positioning the table at an initial reference location is desirable in order to insure accuracy from step to step.

Servo-controlled table positioning systems capable of such accuracy are not readily available and hence electronic compensation of the electron beam together with external measuring units such as interferometers have been employed to overcome positional errors of the table. Such systems have employed microswitches or mechanical stops for establishing the initial reference location from which coordinates are measured. However, a problem occurs in the use of microswitches or mechanical stops, because they are generally not capable of achieving the 1.0 micron or better positioning accuracy desired.

In view of the above background, it is an object of the present invention to provide a table positioning apparatus which provides accurate and repeatable initial positioning of a table at a predetermined reference location.

SUMMARY OF THE INVENTION

The present invention is a table positioning apparatus suitable for use in an electron beam exposure system. A movable table holds a wafer or other work piece. The table is driven by a motor in response to a motor drive signal to position the table at different locations. A position measuring transducer is located in fixed relation to the table to establish a reference position for the table in a local region. The transducer provides a position signal as a function of the table position in the local region relative to the reference position. When the table is at the reference position, the transducer produces the position signal with a reference value which identifies the reference position. An amplifier is provided which is responsive to the position signal to produce a servo signal. The servo signal has a predetermined value (for example, zero) when the position signal is at the reference value and therefore the table is at the reference position.

For servo operation, the servo signal has one sign (for example, positive) when the position signal is less than the reference value, has a zero value when the position signal is equal to the reference value and has the opposite sign (for example, negative) when the position signal is greater than the reference value. A motor drive circuit provides the motor drive signal for driving the motor in response to the servo signal so that the table is driven to the reference position.

In one embodiment, the position measuring transducer is an optical transducer having a light beam covering an area extending over and on either side of the reference position to define the local region. The table carries a blade or other means for blocking the light beam to produce the position signal with a magnitude proportional to the cross-sectional area of the portion of the light beam which is not blocked.

In one embodiment, a measurement unit, such as an interferometer, is provided for measuring the position of the table over an extended table travel which includes the reference position and the local region on either side of the reference position. The measurement unit includes a digital counter storing a count representing the position of the table as measured by the measurement unit. A detector, such as a zero detector, is provided for detecting the reference value (zero value) of the servo signal to provide a servo zero signal. Connection means are provided for connecting the servo zero signal to reset the counter when the table is at the reference position. The resetting establishes a correlation between the measurement unit reading and the actual table position.

In an embodiment where a table apparatus includes an X axis table carried by a Y axis table for moving a work piece in both the X axis and Y axis directions, the foregoing embodiments and features are duplicated once for the X axis and once for the Y axis. In such an embodiment, X axis and Y axis servo zero signals are provided for indicating when the table apparatus is at the X axis and Y axis reference positions, respectively. Logic means are provided for simultaneously detecting the presence of both the X axis and Y axis servo zero signals before resetting the digital counters. The simultaneous presence of both these servo zero signals before resetting is important since a movement in one axis may cause a movement in the other axis. Such a movement in the other axis may displace the table from the reference position in that other axis. In order to insure that the reference positions have been reached in each axis, a delay is provided to allow the combined X axis and Y axis servo systems to settle and become stable before resetting the counters.

Apparatus is provided for controlling the table positioning apparatus in a commanded-position mode for operation in scanning an electron beam to expose a work piece and in a reference-position mode to initially reset the counters to a predetermined reference position.

In accordance with one feature, additional optical transducers and circuitry are provided for detecting when a table has reached a limit position in any direction of travel and for stopping the table.

In accordance with the above summary, the present invention achieves the object of providing a table positioning apparatus for accurately positioning a table at a predetermined reference position.

Additional objects and features of the present invention will appear from the following description in which the preferred embodiments of the invention have been set forth in detail in conjunction with the drawings.

BRIEF DESCRIPTION OF THE DRAWINGS

FIG. 1 depicts a block diagram of a table positioning apparatus in accordance with the present invention.

FIG. 2 depicts a perspective view of a pair of optical transducers and a table-carried blade which form a portion of the FIG. 1 apparatus.

FIG. 3 depicts a schematic representation of an optical transducer which is typical of all the transducers of FIGS. 1 and 2.

FIG. 4 depicts an expanded front view of the table-carried blade positioned relative to the light receiving hole in an optical transducer.

FIG. 5 depicts a representation of the electrical signals produced by the transducer of FIG. 3 as a function of the position of the blade relative to the transducer hole of FIG. 4.

FIG. 6 depicts a front view of the table apparatus of FIG. 1 depicting the location of the position measuring transducers.

FIG. 7 depicts a schematic electrical diagram of one motor drive circuit employed in the FIG. 1 apparatus.

DETAILED DESCRIPTION

In FIG. 1, a table positioning apparatus is shown. The apparatus includes an electron beam column 76 which has an electron source unit 77, a blanking unit 78, a deflecting unit 79, a work chamber 80 and an interferometer unit 81. A table apparatus 24 for holding a work piece 2 is located within the work chamber 80. The table apparatus 24 is movable in both the X axis and the Y axis directions. Table apparatus 24 includes an X axis table 24-X which is driven in the X axis direction and includes a Y axis table 24-Y which is driven in the Y axis direction by the drive shafts 40 and 40', respectively, which are in turn rotated by the servo motors 20 and 20', respectively. The motors 20 and 20' are driven by motor drive signals from the motor drives 18 and 18', respectively.

The interfermoter unit 81 is a conventional measurement unit for measuring the X and Y axis coordinates at which the table apparatus 24 and work piece 2 are positioned. An X axis measured-position signal is provided from an X position output counter 22. Counter 22 is one part of the interferometer unit 81. A Y axis measured- position signal is provided from a Y position counter 22'. Counter 22' is another part of the interferometer 81. For one typical interferometer unit 81, the X and Y axis measured-position signals are 24-bit digital signals output on buses 38 and 38', respectively, which indicate the coordinates at which tables 24-X and 24-Y are positioned with an accuracy of 0.08 times $10^{-6}$ meter.

In FIG. 1, the control system 99 and other elements are typically like those shown in the cross-referenced application entitled ELECTRON BEAM EXPOSURE SYSTEM METHOD AND APPARATUS. Elements common to that application and the present application have the same reference numbers.

In FIG. 1, commanded-position signals are gated to and stored in the X axis and Y axis table control units 10 and 10', respectively. The commanded-position signals indicate coordinates at which the table apparatus 24 is to be positioned during the commanded-position mode of operation. The table control units 10 and 10' also receive, on 24-bit buses 38 and 38', the measured-position signals from the output counters 22 and 22', respectively, of the interferometer unit 81. The table control units 10 and 10' function to provide analog error signals on output lines 16 and 16', respectively. The analog error signal on line 16 is proportional to the difference between the commanded-position signal from bus 16 and the measured-position signal from bus 38. The analog error signal on line 16' is proportional to the difference between the commanded-position signal from bus 6 and the measured-position signal on bus 38'. The error signals on lines 16 and 16' are provided as one set of input signals to the motor drives 18 and 18', respectively.

In FIG. 1, X axis and Y axis servo amplifiers 112 and 112' provide analog signals on lines 117 and 117', respectively, to drive the table apparatus 24 to a reference location during a reference position mode of operation. The servo amplifiers 112 and 112' are differential amplifiers which receive on one of their respective inputs the reference position signals, on lines 150 and 150', from the reference position transducers 82 and 82', respectively. The amplifiers 112 and 112' compare the reference position signals with reference levels, Vr, to provide the analog servo signals on lines 117 and 117', respectively. The analog signals on lines 117 and 117' vary as a function of the positions of the tables 24-X and 24-Y with respect to the X axis reference position and the Y axis reference position, respectively.

The lines 117 and 117' connect as the second set of inputs to the motor drives 18 and 18'. The motor drive 18 selects between either the input analog error signal on line 16 or the analog servo signal on line 117 under the control of the mode signal on line 152. In a similar manner, the Y axis motor drive 18' selects between the error signal on line 16' or the servo signal on line 117' under control of the mode signal on line 152. The motor drives 18 and 18' with either set of inputs function to provide motor drive signals on lines 118 and 118' which drive the motors 20 and 20', respectively.

In FIG. 1, the mode signal on line 152 is provided as the output from a conventional set (S) and reset (R) latch 119 which forms part of the control unit 137. Latch 119 is set to provide the reference position mode signal on line 152 by operation of a START signal. When set by the START signal, the signal on line 152 causes the motor drives 18 and 18' to select the servo signals on lines 117 and 117', respectively. The START signal is provided by the control system 99 via the bus 6 and controls (not shown). The controls associated with the bus 6 are conventional and are not shown in FIG. 1 for clarity. The latch 119 is reset by operation of a RESET signal on line 125 to reset the signal on line 152 to the commanded-position mode. When the signal on line 152 is thus reset to the commanded-position mode, the motor drives 18 and 18' select the input lines 16 and 16', respectively.

The motor drives 18 and 18' receive the X axis and the Y axis limit signals on the four lines of bus 153. The four lines of the bus 153 include the lines 150-1 and 150-2 derived from the X axis limit transducers 83 and 84, respectively and the lines 150'-1 and 150'-2 from the Y axis limit transducers 83' and 84', respectively. The transducers 83, 83', 84 and 84' are typically optical transducers like the transducers 82 and 82'. The limit transducers 83 and 84 are located to define limit positions at the extreme ends of travel of the table 24-X. Similarly, the transducers 83' and 84' are located to define limit positions at the extreme ends of travel of the table 24-Y. Whenever either of the tables has exceeded the respective limit positions a limit signal is generated.

In FIG. 1, the presence of a limit signal on any of the lines of bus 153 functions to cause the motor drives 18 and 18' to immediately stop the drive signals from lines 118 and 118'.

When the motor drives 18 and 18' are operating in the reference position mode, an X axis servo zero signal is provided on line 151 and a Y axis servo zero signal is provided on line 151' to indicate when the tables 24-X and 24-Y have been servoed to the reference positions.

In FIG. 1, the control unit 137 also includes an AND gate 123 which detects the presence of both the X and Y servo zero position signals on lines 151 and 151' together with the mode signal on line 152. The output from the AND gate 123 is connected to a conventional one second delay 124 which, one second after gate 123 is satisfied, provides the RESET signal on line 125. Delay 124 is a conventional device which provides an output after the delay period unless the initiating logical 1 signal from gate 123 has returned to a logical 0 before expiration of the delay period. The function of gate 123 and delay 124 is to insure that both the tables 24-X and 24-Y are simultaneously at the respective reference positions on a stable basis rather than on a transient basis. The delay provides time for the servoing to become stable.

In FIG. 1, the RESET signal on line 125 is connected to reset the mode latch 119. The RESET signal on line 125 also connects to the reset (R) inputs of the counters 22 and 22' of the interferometer unit 81 for resetting those counters. The RESET signal on line 125 additionally connects to the bus 6 to signal the control system 99 that servoing to the reference positions has been completed.

Referring to both FIGS. 1 and 6, the optical transducers 82, 83 and 84 are located fixed with respect to table 24-Y to detect X axis movement of table 24-X. The blade 85 is carried by table 24-X as it translates in the X axis direction. The blade 85 has an end member 85-1 which is configured and located to slide through the optical beams of the transducers 82 and 83 which are located with respect to member 85-1 to establish limit and reference positions at one extreme end of travel of the table 24-X. The blade 85 includes another end member 85-2 which is configured and located to translate through the transducer 84. Transducer 84 is located with respect to member 85-2 to establish a limit position at the other extreme end of travel of the table 24-X. The transducers 82, 83 and 84 and table 24-X are all connected, as shown in FIG. 6, to the table 24-Y which translates them together in the Y axis direction. In this manner, the transducers 82, 83 and 84 have the same identical Y axis movement as the table 24-X. Note that the table 24-X is moved in the X axis direction by the shaft 40. Shaft 40 has a flexible or universal coupling 138 to allow for the Y axis movement. In a similar manner, the portion 24-Y is moved in the Y axis direction by the shaft 40'. Shaft 40' requires no flexible coupling since table 24-Y is not designed for X axis movement. The table 24-Y supports the blade 85' having end members 85'-1 and 85'-2. The end member 85'-1 is configured and located to slide through the transducers 82' and 83' which in turn are located to establish limit and reference positions at one extreme end of travel. The blade member 85'-2 is configured and located to slide through the transducer 84' which in turn is located to establish a limit position at the other extreme end of travel of table 24-Y. The transducers 82', 83' and 84' are mounted on base 139 which is stationary.

In FIG. 2, an enlarged view of the blade end member 85-1 and the transducers 82 and 83 of FIG. 1 are shown. The transducer 82 includes a portion 89 having two parallel arms 96 and 97 defining an opening 86. The arm 96 includes a hole 87 from which a light beam, produced by a light emitting diode, radiates into and across the opening 86. The arm 97 includes a hole 88 opposite the hole 87 for receiving the incident light beam. The blade end member 85-1 is intended to translate from its position at +X2 on the X axis through the opening 86 so as to block all of or portions of the light beam, transmitted from opening 87 toward opening 88 as a function of the position of the blade 85 and end member 85-1. The transducer 82 includes in addition to the portion 89 a portion 98 which schematically represents power source and resistor connections as shown in FIG. 3. The portion 89 is typically an optical transducer of the type sold by Monsanto, Inc. under model number MCA-81. The FIG. 2, the portion 89 and the portion 98 forming the transducer 82 provide an electrical output, Vo, on an output line 150.

In FIG. 2 a second transducer 83, identical to the transducer 82, is located adjacent to the transducer 82 to establish a limit position at −XL1 on the X axis. The transducer 83 is also in position to receive the blade end member 85-1 when the table 24-X is translated to the extreme X axis travel position. The transducer 83 includes the holes 87-1 and 88-1 which permit a light beam to pass. Whenever the blade end member 85-1 travels sufficiently past the openings 87-1 and 88-1, a limit signal is provided on the output line 150-1. The transducers 82 and 83 of FIG. 2, besides showing details of the transducers 82 and 83 of FIG. 1, also represent transducers 82' and 83' of FIG. 1. The transducer 83 of FIG. 2 is also typical of the transducers 84 and 84' of FIG. 1.

In FIG. 3, the optical transducer 82 is shown as typical of all the transducers 82, 82', 83, 83', 84 and 84' of FIG. 1. The transducer 82 includes one portion 89 which is typically a commercially available product, and another portion 98. The portion 98 includes a 200 ohm resistor connected between the terminals 108 and 110 of the portion 89. The terminal 110 is connected to a voltage supply Vcc. A 1,000 ohm resistor is connected between the terminals 109 and 111 of the portion 89.

The terminal 111 provides an output signal, Vo, on line 150.

In FIG. 3, the portion 89 of the transducer 82 includes a light-emitting diode 126 between the terminals 108 and 109 opposite the hole 87. Similarly, a light-actuated transistor 127 is positioned behind the hole 88 for receiving the light beam from the diode 126 across the opening 86.

The emitter of transistor 127 is connected to the base of a second transistor 128 which in turn has its collector and emitter connected to the terminals 110 and 111. The output signal on line 150 is proportional to the quantum of light in the light beam transmitted across the opening 86 between the diode 126 and the transistor 127. When the blade end member 85-1 has moved to block the light beam entirely, no significant collector/emitter current is present in the transistors 127 and 128. Therefore, the voltage on line 150 is approximately zero volts for a fully blocked light beam. When none of the light beam is blocked by the blade 85, then the voltage on line 150 is approximately Vcc. When the blade end 85-1 is positional between $-X1$ and $+X1$ such that only a portion of the light beam is blocked, then the output on line 150 is between zero and Vcc as a direct function of the proportion of light beam which is blocked.

In FIG. 4, further details of the light receiving hole 88 in the transducer 82 are shown relative to the position of end member 85-1 of the blade 85. The hole 88 is approximately one square millimeter and hence has a dimension along the X axis of 1 millimeter. The light beam from hole 87 of FIG. 3 generally covers the entire hole 88 so that the useful part of the incident light beam has a cross-sectional area defined by hole 88. Hole 88 defines a local region extending over and on either side of the reference position. The local region is included within the much larger extended table travel (8 centimeters or more) over which the measurement unit operates to measure table position. The front edge 85-2 of the end member 85-1 is shown in FIG. 4 at a position Xi between O and $+X1$ on the X axis. When the table 24-X of FIG. 1 is moved in the negative X axis direction, the edge 85-3 is moved toward the O position on the X axis and if moved farther in the negative direction will completely cover the opening at the $-X1$ location on the X axis. The amount of light which is transmitted through the hole 88 is a function of the position of the blade 85 relative to the hole 88.

While FIG. 4 has been described with respect to the transducer 82 and X axis movement, each of the other transducers in both axes operates in a similar manner.

In FIG. 5, a wave form representative of the signals employed in the apparatus of FIG. 1 is shown. When the edge 85-3 of the blade 85 is at a positive location of $+X1$ or greater, then the output signal VO on line 150 is approximately Vcc. In the Xi position shown in FIG. 4, the output signal Vo has a value Vi between O and Vcc. When the end member 85-1 covers the hole 88 and the edge 85-3 is at a negative location of $-X1$ or less, then the output signal VO on line 150 is zero volts. At some point approximately halfway between $+X1$ and $-X1$, the output voltage is Vr. This location at which the voltage is Vr is used to define the reference position of the X axis. Whenever the Vr voltage level appears as the output signal Vo on line 150, the edge 85-3 is defined to be at the reference position of the X axis. In a similar manner, the Y axis transducer 82' produces a similar output voltage to establish the reference position of the Y axis.

In FIG. 5, the voltage Vr is selected as the reference voltage input to the X axis servo amplifier 112. The servo signal Vs, output from the servo amplifier on line 117 has a reference value (e.g. zero volts) whenever Vo on line 150 is equal to Vr. Whenever the signal Vo is greater than Vr, then the servo amplifier signal Vs on line 117 tends to be negative (one sign), up to a maximum negative amplitude, $-$Vmax. Whenever the signal Vo is less than Vr, the X axis motor drive 18 drives the table 24-X in the negative X direction. Whenever the signal Vo on line 150 is less than Vr, the signal Vs from the servo amplifier 112 is positive (opposite sign) up to a maximum value $+$Vmax. The positive Vs signal on line 117 causes the motor drive 18 and motor 20 to drive the table 24-X in the positive X direction toward the X axis reference position.

While the description of FIGS. 4 and 5 are with respect to the servo transducer 82 and the X axis movement of table 24-X, the same relationship applies with respect to the servo amplifier 82' and the Y axis movement of table 24-Y.

In FIG. 7, further details of the X axis positional control apparatus is shown and such apparatus is duplicated for the Y axis. In FIG. 7, the table control 10 has its analog error signal output on line 16 connected to one pole of the solenoid actuated switch 160. Similarly, the servo amplifier 112 has its analog servo signal output on line 117 connected to the other input pole of the switch 160.

The switch 160 functions to connect either the signal on line 16 or the signal on line 117 to the line 116 to provide an input to power amplifier 114. Actuation of the switch 160 is under control of the mode signal on line 152. Line 152 is derived from the output of the mode latch 119 in the control 137 of FIG. 1. Amplifier 114 is a conventional differential amplifier for driving a motor in a table positioning system. In addition to the analog signal on line 116, the amplifier 114 receives a signal on line 135 from a tachometer 136. Tachometer 136 is driven by the shaft 40-1 which turns with the drive shaft 40 of the motor 20. The tachometer 136 and the signal on line 135 provide the feedback to amplifier 114 thus forming a speed control system. In this mode of operation, the motor speed is proportional to the voltage on line 116.

The output from the amplifier 114 connects to one of the two input poles of the solenoid actuated switch 156. Switch 156 connects the signal either from the line 115 or from ground to the motor drive line 118. Switch 156 normally connects the line 115 to line 118 except when the table apparatus 24 of FIG. 1 has traveled to any limit position in either direction for both the X and Y axes. When the table 24 has traveled to a limit position, it will actuate one or more of the limit transducers 83 or 83', 84 or 84' to provide a signal on one of the lines 153. When any one of the lines 153 is thus actuated, the NAND gate 154 produces a logical 1 output. That logical 1 is driven through the driver 155 to deenergize the solenoid switch 156 to allow the contact to switch to the ground position. When the table apparatus has not traveled to any limit position, all of the lines 153 are at a logical 1 state and therefore the output from the NAND gate 154 is a logical O. That logical O causes the solenoid switch 156 to be energized thereby causing line 115 to be connected to line 118.

In FIG. 7, the motor drive 18 includes a conventional zero detector 113 for detecting the zero level of the servo signal on line 117 from the servo amplifier 112.

Zero detector 113 detects the zero level on line 117 to produce the X axis servo zero signal on line 151. The servo signal on line 151 indicates that the edge 85-2 (see FIGS. 4 and 5) has been moved to the reference position on the X axis.

The FIG. 7 positional control apparatus is duplicated for the Y axis as indicated in FIG. 1. The duplicated circuitry provides a Y axis servo zero signal on line 151' analogous to the signal on line 151 in FIG. 7.

When the signal on line 151' is generated, it indicates that the table 24-Y of FIG. 1 has been moved to the reference position on the Y axis which is analogous to the reference position indicated in FIGS. 4 and 5 with respect to the X axis.

SUMMARY OF OPERATION

In FIG. 1, when a work piece 2 has been placed on the table 24, it is desired to command the position of the table apparatus 24 to position work piece under commands from the control system 99 in a commanded-position mode of operation. Before the commands can be accurately executed, however, the table apparatus 24 is desirably repositioned to some predetermined reference location so that the measurement unit can be reset to establish a known origin from which coordinates can be measured. That reference location is at the X axis and Y axis reference position established by the position measuring transducers. In order to position the table apparatus 24 at the zero X axis and Y axis reference positions, control system 99 issues a START command to set the mode latch 119 to the reference position mode. With the servo latch 119 thus set, the mode line 152 is enabled causing the motor drives 18 and 18' (using switch 160 in FIG. 7) to connect the servo amplifiers 112 and 112' as the selected inputs. The motor drives 18 and 18' then drive the table 24 in both the X and Y axes toward the reference positions established by transducers 82 and 82', respectively. In the manner described in connection with FIG. 5, the blade edge 85-2 will be driven until the Vs signals output from the servo amplifiers 112 and 112' are each simultaneously equal to zero. When the zero detector 113 in the X axis and the corresponding zero detector in the Y axis (not explicity shown) produce logical 1 servo zero signals on lines 151 and 151', AND gate 153 is satisfied to produce an initiate reset signal as an input to delay 124. After the one second delay in delay 124, the RESET signal is generated to reset mode latch 119 to the commanded-position mode and to reset the counters 22 and 22' in the interferometer unit 81 to all 0's. In this manner, the interferometer unit 81 is and can be repeatedly reset so as to measure from a predetermined reference location of the table apparatus 24. It has been found that the measurement unit is reset with an accuracy greater than $1 \times 10^{-6}$ meters. Therefore, when the operation to position the table apparatus 24 and a work piece 2 at a commanded position, an accuracy of better than $1 \times 10^{-6}$ meters with respect to a predetermined reference location can be maintained.

While the invention has been particularly shown and described with reference to the preferred embodiments thereof, it will be understood by those skilled in the art that those changes in form and details may be made therein without departing from the spirit and the scope of the invention.

What is claimed is:

1. A table positioning apparatus including in each of first and second axes,
   a movable table,
   a motor for driving the table in response to a motor drive signal,
   an optical position measuring transducer located to establish a reference position for said table in a local region defined by a light beam, and operative to provide a reference position signal as a function of the table position relative to said reference position in the local region, said position signal having a reference value when the table is at the reference position,
   an amplifier responsive to said reference position signal to produce a servo signal having a positive sign when said position signal is less than said reference value, having a zero value when said position signal is equal to said reference value, and having a negative sign when said position signal is greater than said reference value,
   a motor drive for providing said motor drive signal in response to said servo signal whereby said table is driven to said reference position and causes said servo signal to have said zero value to indicate that said table is at said reference position,
   a zero detector for detecting said zero value to provide a servo zero signal,
   an interferometer for measuring the position of said table over a table travel greater than and including said local region, said measurement unit including a digital counter for storing a count representing the position of the table as measured by said measurement unit,
   means for connecting said servo zero signal to reset said counter to establish said count to indicate said reference position.

2. A table positioning apparatus comprising,
   a movable table,
   motor means for driving the table in response to a motor drive signal,
   position measuring transducer means located to establish a reference position for said table in a local region and operative to provide a reference position signal as a function of the table position relative to said reference position in the local region, said position signal having a reference value when the table is at the reference position, said transducer means including an optical transducer having a light beam covering an area including said reference position and defining said local region and said table apparatus including means for blocking said light beam as a function of table position to produce said position with a magnitude proportional to the area of the light beam not blocked,
   amplifier means responsive to said reference position signal to produce a servo signal having a predetermined value when said position signal is equal to said reference value,
   motor drive means for providing said motor drive signal in response to said servo signal whereby said table is driven to said reference position and causes said servo signal to have said predetermined value to indicate that said table is at said reference position.

3. The apparatus of claim 2 including detector means for detecting the predetermined value of said servo signal to provide a servo zero signal for indicating when said table is at said reference position.

4. The apparatus of claim 3 including measurement unit apparatus for measuring the position of said table over a table travel greater than and including said local region and the reference position, said measurement unit including a digital counter for storing a count representing the position of the table as measured by the measurement unit, means for connecting said servo zero signal to reset said counter when said table is at said reference position.

5. The apparatus of claim 4 wherein said connection means includes delay means for delaying the reset of said counter.

6. The apparatus of claim 2 including table control means for providing an analog error signal for driving the table to a commanded-position, and wherein said motor drive means includes switch means for selecting either said error signal or said servo signal to provide said motor drive signal.

7. The apparatus of claim 6 including a mode latch settable to cause said switch means to select said servo signal during a reference mode of operation, including means for providing a reset signal when said table is at said reference position, including means connecting said reset signal to reset said mode latch to cause said switch means to select said error signal during a commanded-position mode of operation.

8. The apparatus of claim 2 wherein said motor drive means includes switch means for connecting said motor drive signal to said motor means in one position and for connecting a common potential to said motor means in a second position, said switch means responsive to a limit signal for connecting the common potential to said motor means, said apparatus including limit transducer means located to establish a limit position for said table, said limit transducer means generating said limit signal when said table has traveled to said limit position.

9. A table positioning apparatus comprising,
   a movable table apparatus including an X axis table movable in the X axis direction carried by a Y axis table movable in the Y axis direction,
   motor means including X axis and Y axis motors for driving the X axis and Y axis tables, respectively, in response to X axis and Y axis motor drive signals, respectively,
   position measuring optical transducer means including an X axis transducer and a Y axis transducer located to establish X axis and Y axis reference positions, respectively, for said tables and operative to provide X axis and Y axis position signals, respectively, as a function of X axis and Y axis table positions relative to said X axis and Y axis reference positions, respectively, said X axis and Y axis position signals having X axis and Y axis reference values when the X axis and Y axis tables, respectively, are at the X axis and Y axis reference positions,
   amplifier means including an X axis amplifier and a Y axis amplifier responsive to said X axis and Y axis position signals, respectively, to produce X axis and Y axis servo signals, each of said servo signals having one sign when the corresponding position signal is less than the corresponding reference value, having a zero value when the corresponding position signal is equal to the corresponding reference value, and having the opposite sign when the corresponding position signal is greater than the corresponding reference value,
   motor drive means including X axis and Y axis motor drives for providing said X axis and Y axis motor drive signals, respectively, in response to said X axis and Y axis servo signals, respectively, whereby said X axis and Y axis tables are driven to said X axis and Y axis reference positions, respectively, and whereby said table apparatus is simultaneously positioned at both said X axis and Y axis reference positions.

10. The apparatus of claim 9 wherein each of said X axis and Y axis transducers includes means for generating a light beam covering an area including said X axis reference position and said Y axis reference position, respectively, and wherein said X axis and Y axis tables include means for blocking said light beams as a function of table positions to produce said X axis and Y axis position signals, respectively, with magnitudes proportional to the areas of the light beams not blocked.

11. The apparatus of claim 9 including X and Y detector means for detecting the zero values of said X axis and Y axis servo signals, respectively, to provide X axis and Y axis servo zero signals, respectively, for indicating when said tables are at said X axis and Y axis reference positions, respectively.

12. The apparatus of claim 11 including control means for sensing the presence of both said X axis servo zero signal and said Y axis servo zero signal to provide a combined servo zero signal for indicating when said table apparatus is at both said X axis reference position and said Y axis reference position.

13. The apparatus of claim 12 including X axis and Y axis measurement units for measuring the positions of said X axis and Y axis tables, respectively, over X axis and Y axis table travels, respectively, including the X axis and Y axis reference positions, respectively, said X axis and Y axis measurement units including X axis and Y axis digital counters, respectively, for storing counts representing the positions of the X axis and Y axis tables, respectively, as measured by the X axis and Y axis measurement units, respectively, said table positioning apparatus including connection means for connecting said combined servo zero signal to reset said X axis and said Y axis counters.

14. The apparatus of claim 13 wherein said connection means includes a delay circuit for delaying said combined servo zero signal before resetting said counters.

15. In a servo control system for positioning a table wherein a servo motor is rotated by the output of a servo amplifier and a tachometer is driven by the servo motor and feeds back a generating signal to one input of the servo amplifier, a table stopping system comprising;
   first photo-coupler provided at a first predetermined end position at which the movement of the table is to be terminated, said photo-coupler providing an output signal,
   a knife blade provided on said table for cutting a light beam in said first photo-coupler when the table is positioned at the first predetermined end position, and,
   a first comparator having an output connected to another input of the servo amplifier and having first and second inputs, the first input being supplied with a first reference voltage and the second input being supplied with the output signal of the first photo-coupler, whereby a zero signal on the output of said comparator stops the movement of the table at the first predetermined end position.

16. The system of claim 15 wherein said first photo-coupler comprises a light emitting diode and a photosensitive transistor.

17. The system of claim 15 wherein said reference voltage equals approximately one-half the maximum output voltage of said first photo-coupler.

18. The system of claim 15 wherein said table includes a supporting means in the work chamber of an electron beam exposure system for supporting a work piece to be exposed with an electron beam.

* * * * *